(12) United States Patent
Oh et al.

(10) Patent No.: US 7,745,899 B2
(45) Date of Patent: Jun. 29, 2010

(54) PHOTOMASK AND ITS METHOD OF MANUFACTURE

(75) Inventors: Ho-Jin Oh, Seoul (KR); Je-Min Park, Gyeonggi-do (KR); Jee-Eun Jung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 334 days.

(21) Appl. No.: 11/832,270

(22) Filed: Aug. 1, 2007

(65) Prior Publication Data

US 2008/0044989 A1 Feb. 21, 2008

(30) Foreign Application Priority Data

Aug. 21, 2006 (KR) .................. 10-2006-0078848

(51) Int. Cl.
*H01L 29/423* (2006.01)
*H01L 21/3205* (2006.01)

(52) U.S. Cl. ....................... 257/435; 438/585

(58) Field of Classification Search ............... 438/585; 257/91, 428–435, E21.023; *G03F 1/14*
See application file for complete search history.

(56) References Cited

U.S. PATENT DOCUMENTS

2006/0148158 A1* 7/2006 Cho et al. ............... 438/199

FOREIGN PATENT DOCUMENTS

| KR | 1999-024655 | 4/1999 |
| KR | 2004-0013460 | 2/2004 |
| KR | 2005-0008052 | 1/2005 |
| KR | 2005-0066842 | 6/2005 |
| KR | 2006-0025071 | 3/2006 |
| KR | 2006-0080715 | 7/2006 |
| KR | 2007-0056415 | 6/2007 |

OTHER PUBLICATIONS

English language abstract of Korean Publication No. 2004-0013460.
English language abstract of Korean Publication No. 2005-0008052.
English language abstract of Korean Publication No. 2005-2006-0025071.

* cited by examiner

*Primary Examiner*—Kiesha R Bryant
*Assistant Examiner*—John Doyle
(74) *Attorney, Agent, or Firm*—F. Chau & Associates, LLC

(57) ABSTRACT

An embodiment of a photomask for forming gate lines and a method of manufacturing semiconductor devices using the photomask is disclosed. The photomask includes a photomask substrate, gate line mask patterns that define gate lines that cross at least one active region on a semiconductor substrate, and that are arranged in parallel, gate tab mask patterns formed on both sides of each gate line mask pattern, and joints formed between adjacent gate tab mask patterns, and that include a separation region. A relatively large gate tab mask pattern can be formed using the photomask. And a short channel effect at the boundary of the active region can be improved with the large gate tab mask pattern, so the characteristics and reliability of the semiconductor devices can be improved.

11 Claims, 9 Drawing Sheets

PHOTOMASK AND ITS METHOD OF MANUFACTURE

CROSS REFERENCE TO RELATED APPLICATION

This application claims priority from Korean Patent Application No. 10-2006-078848 filed on Aug. 21, 2006, in the Korean Intellectual Property Office, the disclosure of which is incorporated herein by reference in its entirety.

BACKGROUND OF THE INVENTION

1. Field of the Invention

The present invention relates to a photomask, such as a photomask for forming gate lines on a semiconductor substrate, and a method of manufacturing a semiconductor device using the photomask.

2. Description of the Related Art

Photomasks include pattern information used for transferring shapes of various patterns onto a silicon wafer for fabricating semiconductor devices. Therefore, the most fundamental task of forming fine patterns of semiconductor devices is dependent upon photomasks. Typically all patterns of semiconductor devices are formed by photolithography processes that use photomasks.

Figure 1A:
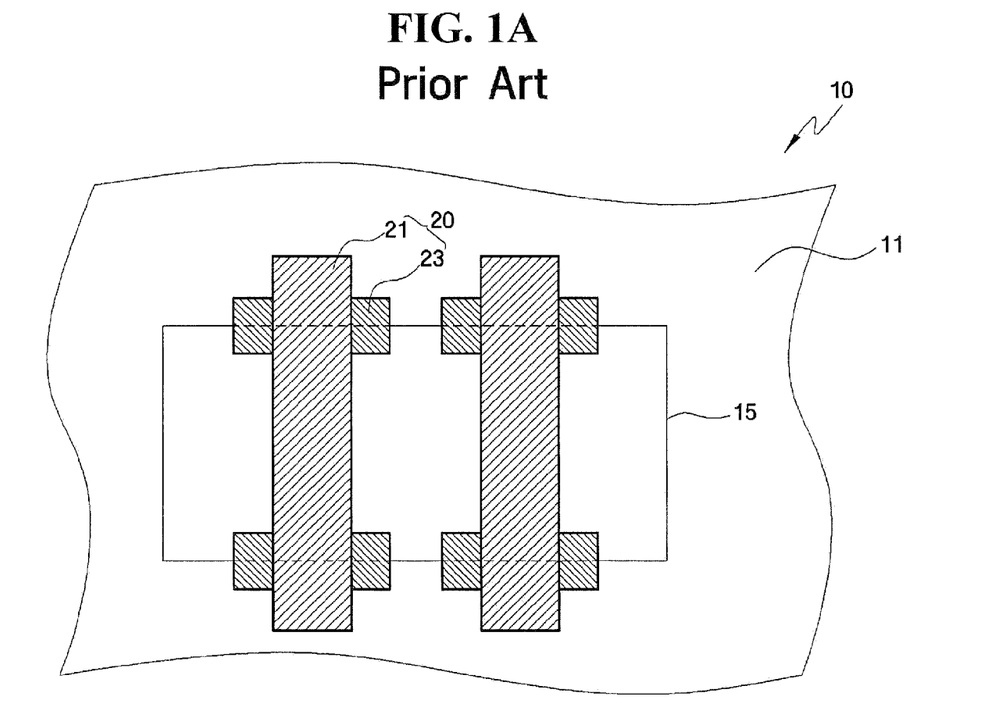
FIG. 1A shows a top view of a photomask according to the conventional art.

FIG. 1A is a conventional photomask for forming gate lines. Referring to FIG. 1A, the conventional photomask 10 for forming the gate lines includes gate line mask patterns 21 and gate tab mask patterns 23 on a substrate 11. An active region 15 is illustrated as an example of where the mask patterns may be situated while forming the gate lines. The gate line mask patterns 21 cross the active region 15, and are parallel to each other. The gate tab mask patterns 23 are located on both sides of the gate line mask patterns 21, and cover the boundary of the active region 15 and an adjacent isolation region. Due to increasing integration of semiconductor devices, active region sizes and channel lengths continue to decrease to a point where hot electron induced punch-through (HEIP) may occur between the active region 15 and the isolation region. Therefore, the gate tab mask patterns 23 are formed to increase the width of the gate lines on the active/isolation region boundary to help prevent HEIP.

Figure 1B:
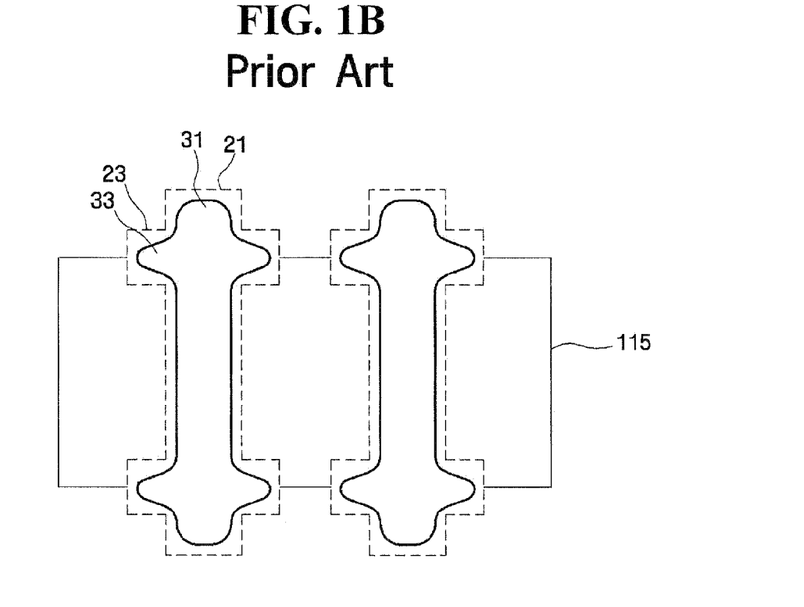
FIG. 1B shows a top view of gate lines that are formed with the conventional photomask of FIG. 1A.

Although gate lines 31 are formed using the photomask 21 illustrated in FIG. 1A, the actual pattern formed on a semiconductor device by the technique illustrated above would appear as illustrated in FIG. 1B. Due to optical proximity effects, pattern lengths of gate tabs 33 actually formed on the semiconductor substrate 11 are reduced from the length of the original gate mask patterns 23 and the corners of gate tabs 33 are rounded. As a result, semiconductor device characteristics may suffer from a reduced channel length. Furthermore, and as shown in FIG. 1B, because the gate tabs are in the shape of curve with a peak, the channel length will be further decreased if a misalignment occurs, further deteriorating the semiconductor device characteristics.

SUMMARY OF THE INVENTION

In an embodiment, the present invention provides a photomask for forming gate lines.

The present invention also provides a method of manufacturing a semiconductor device using the photomask.

According to an exemplary embodiment of the present invention, a semiconductor device includes a photomask substrate, a plurality of gate line mask patterns that cross at least one active region on a semiconductor substrate and are arranged in parallel to each other, gate tab mask patterns formed on both sides of each gate line mask pattern, and joints formed between two adjacent gate tab mask patterns, that include a separation region.

According to another exemplary embodiment of the present invention, a method of fabricating a semiconductor device includes providing a semiconductor substrate that includes an active region that is defined by an isolation region, forming a gate insulating layer and a gate electrode layer on the gate insulating layer, forming a photoresist layer on the gate electrode layer, forming a photoresist pattern that defines gate lines on the gate electrode layer by a photolithography process with a photomask, wherein the photomask comprises a photomask substrate, a plurality of gate line mask patterns that cross at least one of the active regions on the semiconductor substrate and are arranged in parallel, gate tab mask patterns formed on both sides of each gate lines mask pattern, and joints formed between two adjacent gate tab mask patterns, and that includes a separation region, and forming the gate lines by patterning the conductive layer for gate.

BRIEF DESCRIPTION OF THE DRAWINGS

The above and other features and advantages of the present invention will become apparent by describing in detail exemplary embodiments thereof with reference to the attached drawings in which.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention should only be defined by the appended claims.

In some exemplary embodiments, well-known processes, structures, and technologies are not explained specifically in order to avoid ambiguous interpretation of the invention.

Terminologies in this specification are to explain the exemplary embodiments of the present invention, and not to limit the present invention. Unless specifically stated, a word in singular form also represents the plural form. The terms "comprise" and "comprising" used in the specification may include components, steps, operations, and devices specifically mentioned, as well as other components, steps, operations, and devices. Like reference numerals refer to like elements throughout the specification.

Also, exemplary embodiments of the present invention may be described by referring to figures of the present invention, cross-sectional views, and/or simplified diagrams. And the shape of the figures can be changed due to fabrication technologies and/or allowable errors. Therefore, the present invention should not be construed as being limited to the embodiments set forth herein, but may include variations of the shape formed according to the fabricating process. In the drawings, the shape and thickness of layers and regions may be exaggerated or reduced for clarity.

Hereinafter, a photomask for forming gate lines and a method of manufacturing semiconductor devices using the same will be described with reference to FIGS. 2 through 10B.

Figure 2:
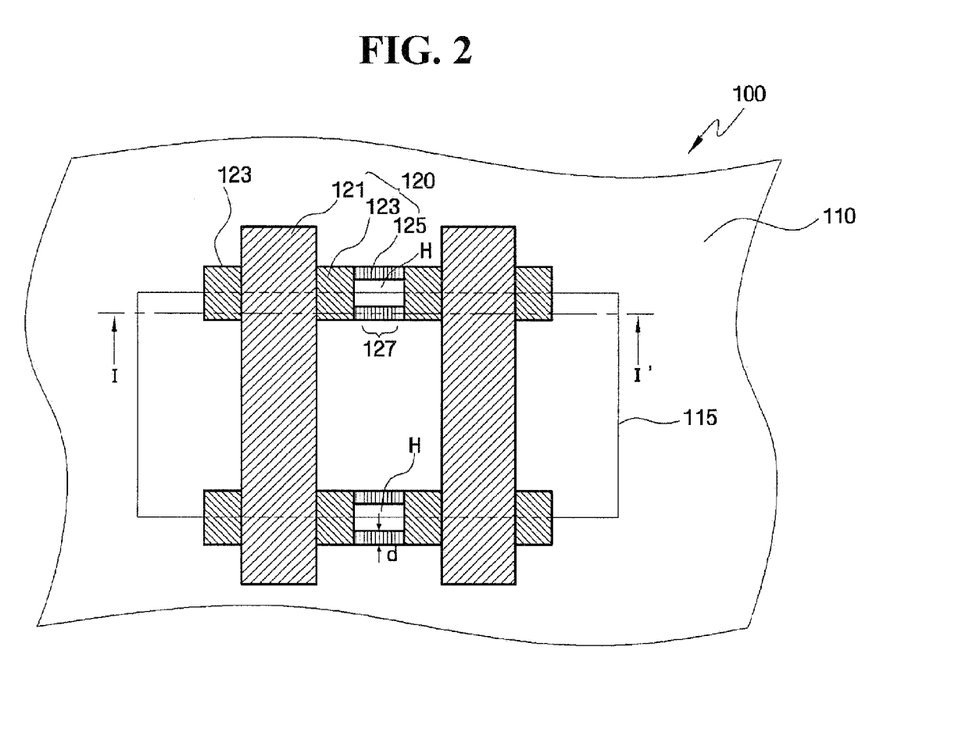
FIG. 2 shows a top view of a photomask structured according to an exemplary embodiment of the present invention.
Figure 3A:
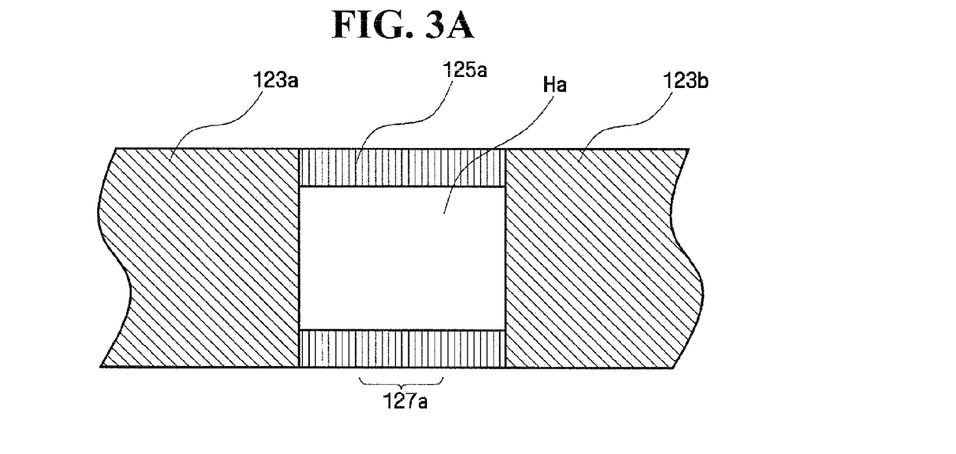
FIGS. 3A through 3E show top views of joints of photomasks structured according to other exemplary embodiments of the present invention.
Figure 3B:
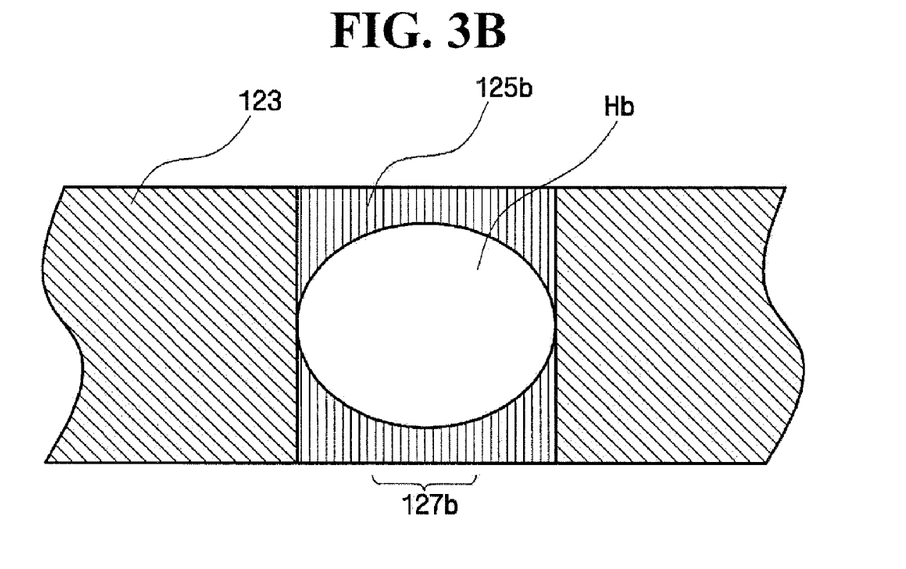
Figure 3C:
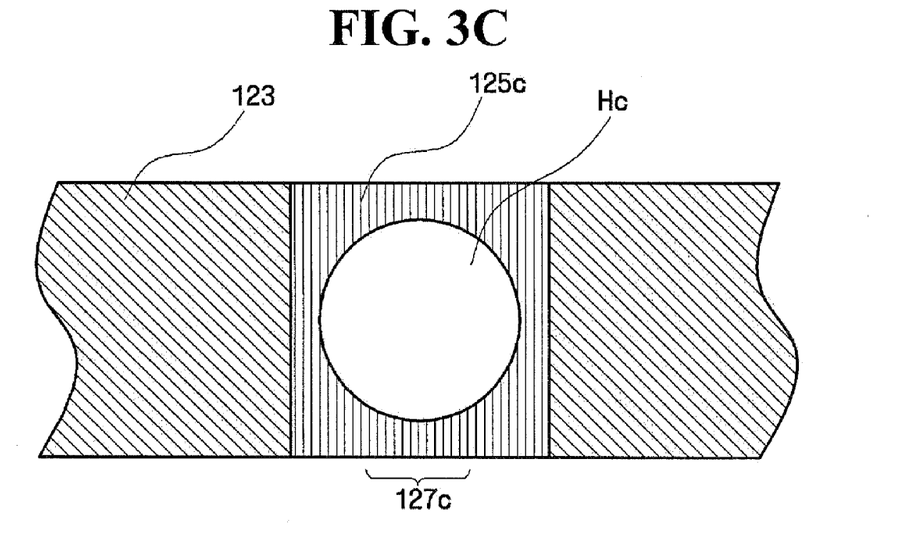
Figure 3D:
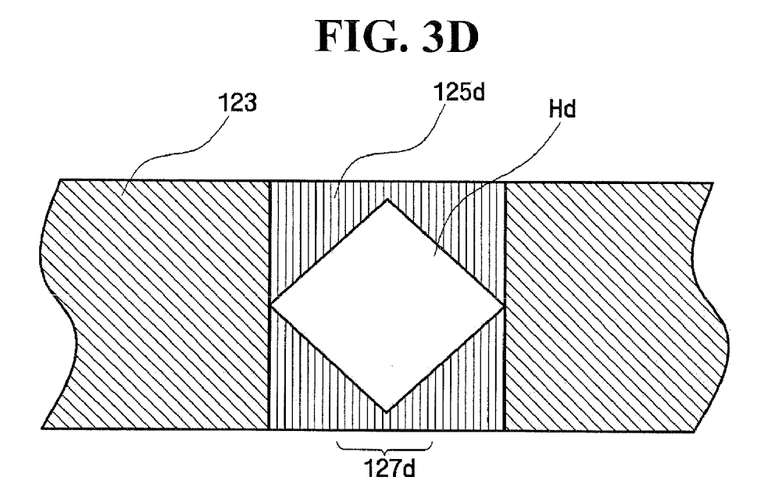
Figure 3E:
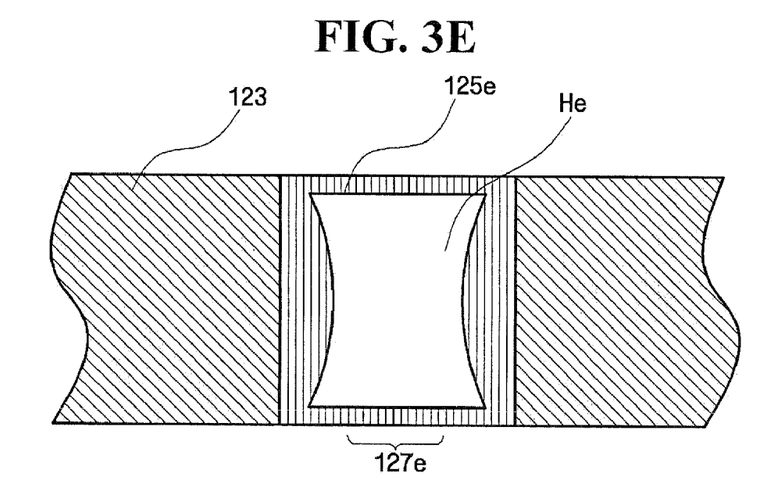

FIG. 2 shows a top view of a gate pattern photomask 100 according to an exemplary embodiment of the present invention.

Referring to FIG. 2, the gate pattern photomask 100 may include a substrate 110 and mask patterns 120 formed on the substrate 110. The mask patterns 120 may include gate line mask patterns 121, gate tab mask patterns 123, and joints 125 connecting tabs on adjacent gate line mask patterns. An active region 115 of FIG. 2 is shown as an example of a possible positioning of the gate pattern photomask 100, such as in the present embodiment (the active region 115 is a virtual image).

The substrate 110 may be formed of a transparent material to transmit light such as from an i-line, KrF or ArF excimer lasers. For example, the substrate 110 can be formed of glass, fused silica, or quartz.

The gate line mask patterns 121 define a plurality of gate lines that span across more than one of the active regions 115 and are arranged in parallel. The gate tab mask patterns 123 are located on both sides of the gate line mask patterns 121. The gate tab mask patterns 123 cover a boundary of the active region 115 and an isolation region. Therefore the gate tab mask patterns 123 can increase the channel length to help prevent HEIP, which can happen between the active region 115 and an isolation region.

The joints 125 are formed between adjacent gate tab mask patterns 123. As shown in FIG. 2, the joints 125 connect an edge of a first gate tab mask pattern 123a to the opposite edge of a second/adjacent gate tab pattern 123b. The joints 125 are configured according to the invention with the purpose of decreasing optical proximity effects at edge regions, especially at corners of the gate tab mask patterns 123 (e.g. patterns 123a and 123b). Therefore, resulting gate tabs can have a more reinforced corner than that of conventional gate tabs.

The joints 125 may define a hole H by themselves or with the gate tabs mask pattern 123.

FIGS. 3A through 3E show top views of joints of photomasks, according to exemplary embodiments of the present invention.

Referring to FIGS. 3A through 3E, the holes Ha, Hb, Hc, Hd, He can be formed into various shapes such as a tetragon, an oval, a circle, a diamond, a triangle, a polygon, and so on. The shapes and/or boundaries of the holes Ha, Hb, Hc, Hd, He can be defined by the joints 125a, 125b, 125c, 125d, 125e with or without the gate tab mask patterns 123.

The joint 125 includes a separation region 127 that may have a size equal to or less than the marginal resolution of light to be used in the photolithography. That is, the separation region of the joints 125 of the present invention means a region where the pattern is not formed since the size of the region is equal to or less than the marginal resolution of the light. The separation region 127 can be located around the center of the joints 125, mid-span between the adjacent gate tab mask patterns 123. The thickness d of the separation region 127 can be determined according to the wavelength of the light. The resolution of the light can be determined based on the process ability of those who perform a process of an embodiment of the present invention. The marginal resolution of a photolithography process is determined by the equation:

$$R = k \cdot \lambda / Na,$$

where k is a process constant, $\lambda$ is the wavelength of the light, and Na is a numerical aperture of the projection lens in the photolithography equipment. Here, $\lambda$ and Na are fixed values, and k corresponds to the process ability of those who perform the present invention. It is well known that R has a distribution of $0.5\lambda$ to $\lambda$. Therefore "marginal resolution" in the present invention can be understood as various numerical values decided according to the process ability of those who perform the present invention. And if high-resolution techniques, such as an OAI (Off Axis Illumination) or a pattern formation using a phase shift mask, are not used, then the marginal resolution can be similar to the wavelength of the light that is used. For example, wavelengths of the i-line, the KrF excimer laser, and the ArF excimer laser are 365 nm, 248 nm, and 193 nm, respectively.

Therefore if the size of the separation region 127 of the joints 125 is equal to or less than the marginal resolution of the photomask, a pattern will not be formed on a semiconductor substrate, and the gate tab mask patterns 123 are formed as separate entities. As a result, the gate lines are not connected, but are insulated from each other.

The gate line mask patterns 121, the gate tab mask patterns 123, and the joints 125 are formed on the substrate 110, and can determine its transparency. That is, each of the gate line mask patterns 121, the gate tab mask patterns 123, and the joints 125 can be formed on a binary mask or a phase shift mask. In other words, if the patterns are formed on a phase shift mask, the light that is transmitted through the gate line mask patterns 121, the gate tab mask patterns 123, and the joints 125 can have a phase difference with the light that is transmitted through the substrate 110. The phase difference can be, for example, $\pi$ radians. Therefore, each of the gate line mask patterns 121, the gate tab mask patterns 123, and the joints 125 can be comprised of a (100%) full shield layer such as aluminum (Al), tungsten (W), and chromium (Cr), or an attenuating (partial) shield layer such as MoSi, MoSiN, MoSiON, and so on.

Hereinafter, a method of manufacturing a semiconductor device with a photomask according to various exemplary embodiments will be described with reference to FIGS. 4 through 9. FIGS. 4 through 9 are cross-sectional views sequentially illustrating a method of manufacturing a semiconductor device with a photomask according to various exemplary embodiments, and taken along line I-I' of FIG. 2.

Hereinafter, conventional process steps according to processes that are well known to those skilled in the art will be roughly described in order to concentrate explanations on embodiments of the present invention. And similar structures and materials, which can be applied in a similar manner as described for the semiconductor device, are not described further or are described only briefly to avoid redundant descriptions.

Figure 4:
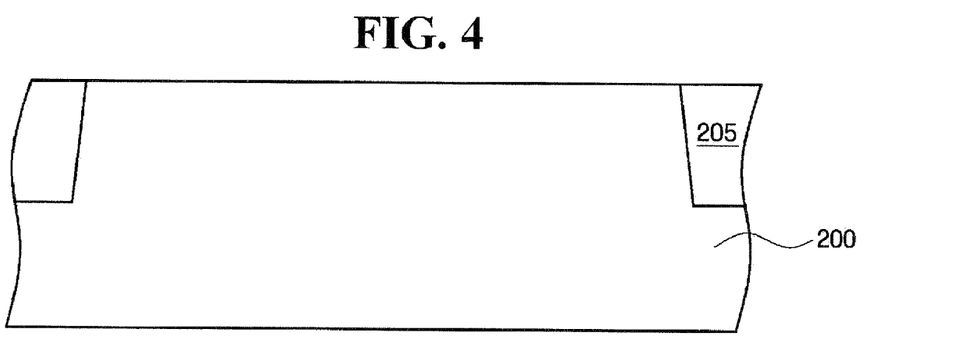
FIGS. 4 through 9 show cross-sectional views illustrating progressive process steps for fabricating a semiconductor device with a photomask according to various exemplary embodiments of the present invention.

First, a semiconductor substrate 200 including an active region, which is defined by an isolation region 205, is provided as shown in FIG. 4. The isolation region 205 can be formed by a LOCOS (Local Oxidation of Silicon) process or a STI (Shallow Trench Isolation) process. The STI process is illustrated in the following exemplary embodiment.

Figure 5:
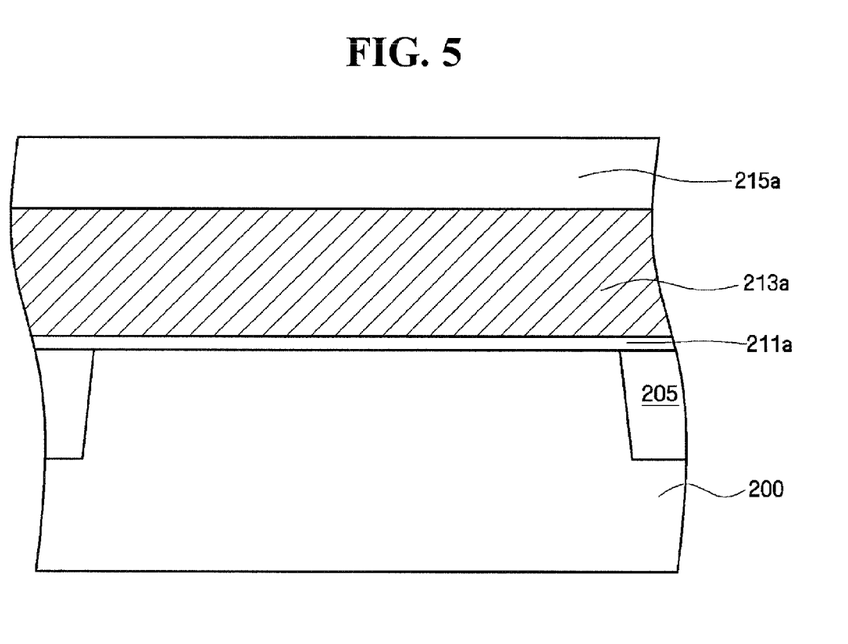

Next, a gate insulating layer 211a, a gate electrode layer 213a, and an insulating layer for a hard mask 215a are sequentially formed on the semiconductor substrate 200, as shown in FIG. 5.

Silicon oxide may be formed by a thermal oxidation of the semiconductor substrate 200. SiON, GexOyNz, GexSiyOz, a high-k material, a combination of these materials, and sequentially stacked layers of these materials can be used as the gate insulating layer 211a. For example, the high-k material can be hafnium oxide, zirconium oxide, aluminum oxide, tantalum oxide, hafnium silicate, zirconium silicate, or a compound layer.

Also, the gate electrode layer 213a can be formed with a single layer such as polysilicon layer, a metal layer, a metal silicide layer, or a combination of these layers stacked. Other materials may be used. The polysilicon layer may be a conductive polysilicon layer, e.g., doped polysilicon that includes at least one of boron (B), phosphorous (P), arsenic (As), or indium (In). The metal layer can be formed with W, Mo, Ti, Ta, Al, Hf, Zr, Pt, Ru, Rd, Ni, Co, or a compound thereof. The metal silicide layer can be formed with a combination of the above-mentioned metal layer and silicon.

The insulating layer for the hard mask 215a can be formed of silicon oxide, silicon nitride, or silicon oxy-nitride, but is not limited to these materials. Silicon nitride is used in the exemplary embodiment of the present invention.

Figure 6:
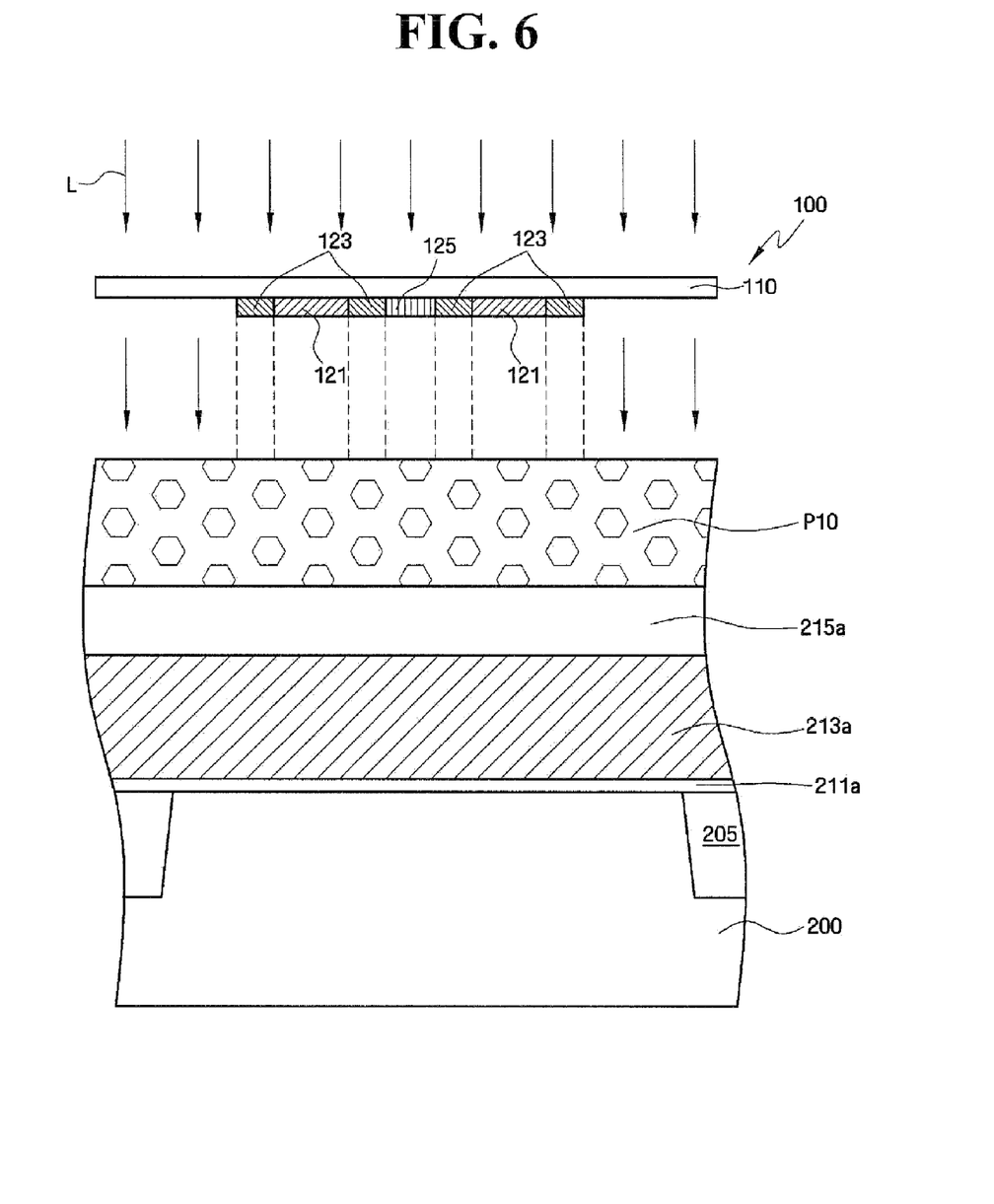

Then, a photoresist layer P10 is formed by applying a photoresist on the insulating layer for the hard mask 215a, as shown in FIG. 6.

The photoresist layer P10 can be a positive type or a negative type, and can be formed by a spin-coating method, but is not limited thereto.

Then, an exposure process may be performed by applying light L to the photoresist layer P10 with a gate pattern photomask 100.

An I-line, a KrF excimer laser, or an ArF excimer laser can be used as a light exposure source during an exposure process, and a developer can be selected according to the material of the photoresist layer during a developing process.

Here, the gate pattern photomask 100 is the photomask according to various exemplary embodiments of the present invention, comprising a substrate 110, the gate line mask patterns 121, the gate tab mask patterns 123, and the joints 125.

As mentioned above, the mask patterns 120 comprise the gate line mask patterns 121, the gate tab mask patterns 123, and the joints 125.

The gate line mask patterns 121 define a plurality of the gate lines that cross one or more of the active regions and are arranged in parallel.

The gate tab mask patterns 123 are located on both sides of the gate line mask patterns 121. The gate tab mask patterns 123 cover the boundary between the active region and the isolation region 205. Therefore the gate tab mask patterns 123 may increase the channel length to help prevent HEIP that can otherwise occur at the boundary.

The joints 125 are formed between adjacent gate tab mask patterns 123. The joints 125 can connect an edge of one gate tabs mask pattern 123 to the edge of another gate tabs mask pattern 123.

The joints 125 can define a hole H by themselves, or with the gate tab mask patterns 123. As shown in FIGS. 3A through 3E, the shape of the hole can be a tetragon, an oval, a circle, a diamond, a triangle, a polygon, and so on.

The joints 125 include a separation region 127 next to the hole H, and the size of the separation region 127 may be equal to or less than the resolution margin of the light. That is, the separation region 127 in this present invention means the region where a pattern is not formed by the light, resulting in a separated portion of the photoresist pattern. The thickness d of the separation region 127 can be determined according to the wavelength of the light.

Because the pattern is not formed with the separation region 127 of the joints 125 during the light exposure, the gate lines would not be connected, and are thus insulated from each other. The separation region 127 is not limited by the region that is illustrated in drawings.

The gate line mask patterns 121, the gate tab mask patterns 123, and the joints 125 are formed on the substrate 110, and may determine its transparency. The gate line mask patterns 121, the gate tab mask patterns 123, or the joints 125 can be formed on a binary mask or an attenuated shift mask. And each of the gate line mask patterns 121, the gate tab mask patterns 123, and the joints 125 can be formed with a 100% shield layer such as aluminum (Al), tungsten (W), chromium (Cr), and so on, or a halftone shield layer such as MoSi, MoSiN, MoSiON, and so on.

The joints 125 can decrease an optical proximity effect of the edge region of the gate tab mask patterns 123, and need not be transferred to the photoresist during the exposure process. In this case, the pattern that corresponds to the joints 125 need not be formed on the photoresist pattern P20.

Figure 7:
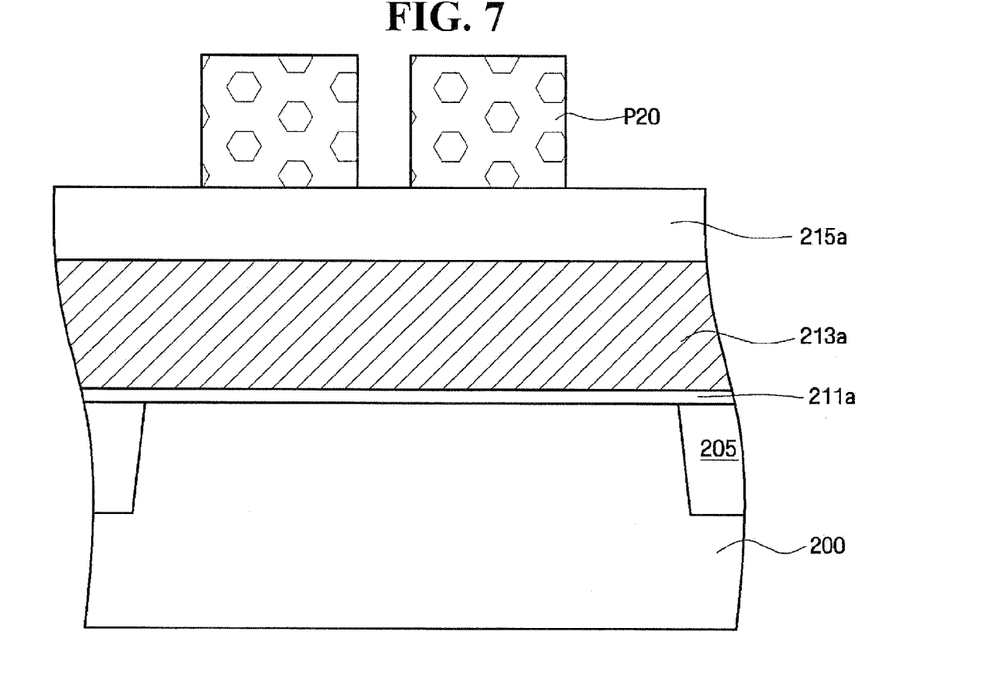

As shown in FIG. 7, the photoresist pattern P20 is completed by the developing process. A developer during the developing process can be selected according to the kind of photoresist used.

Figure 8:
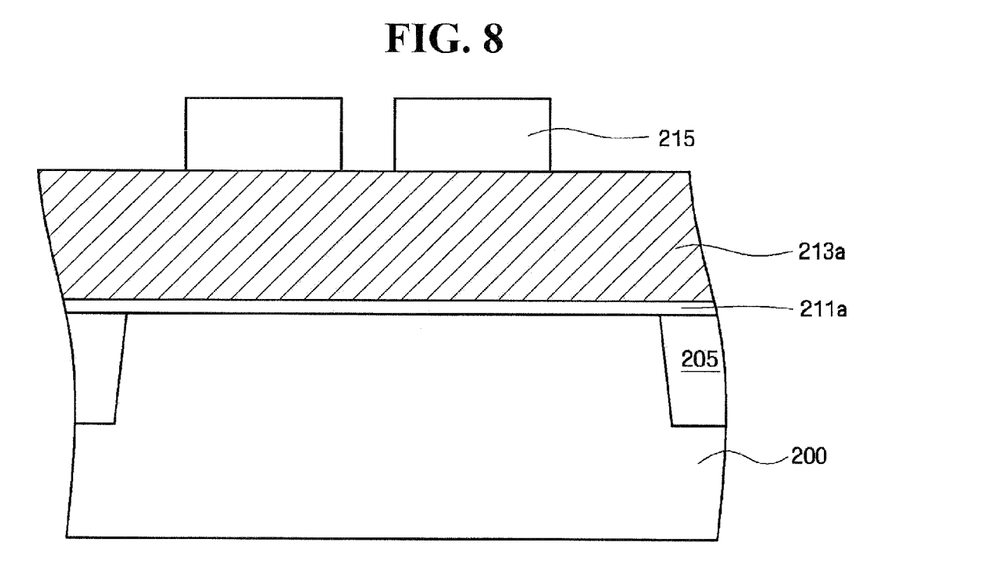

Referring to FIG. 8, a hard mask layer 215 is formed with the photoresist pattern P20 of FIG. 7 as an etch mask. The etching can be performed by a conventional dry etch or wet etch. The dry etch can be performed with a gas containing C and F, and the wet etch can be performed with phosphoric acid.

After the hard masks 215 are formed, a residue of the photoresist pattern P20 of FIG. 7 may be removed.

At this time, the photoresist pattern P20 of FIG. 7 may be removed by a conventional ashing process with oxygen gas, or by a conventional wet stripping with sulfuric acid.

Figure 9:
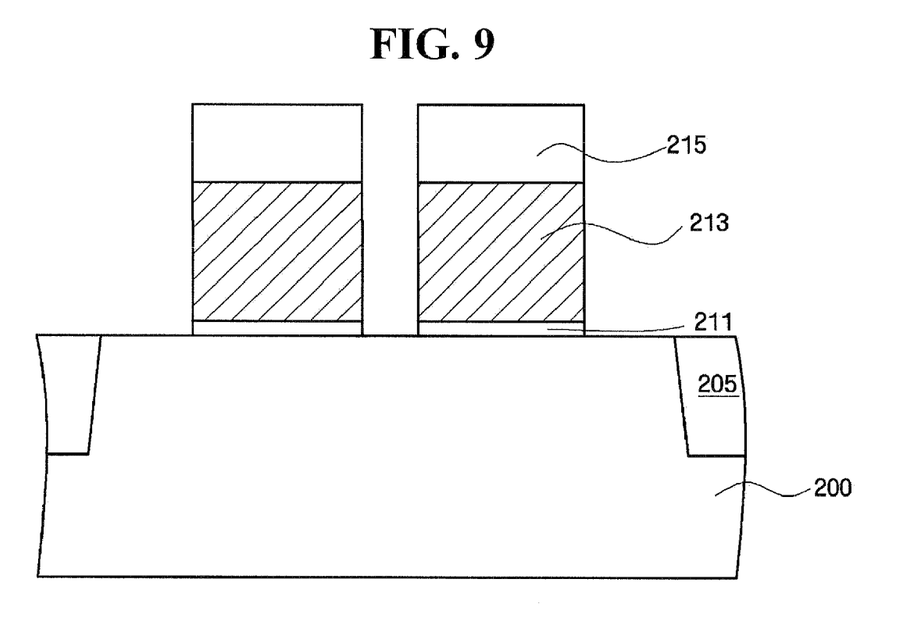

Then, gate lines 213 are completed by patterning with the hard mask 215 as an etch mask as shown in FIG. 9.

Then, a semiconductor device can be completed, for example, by performing a source/drain forming step, a spacer-forming step on each transistor, an interlayer-dielectric-layer-forming step, a step for forming a wire that can input/output a signal to/from each transistor, a passivation-layer-forming step on the substrate, and a package step of the substrate according to process steps that are well known to those who skilled in the art. These process steps are not explained specifically to avoid obscuring the description of the embodiments of the present invention.

Figure 10A:
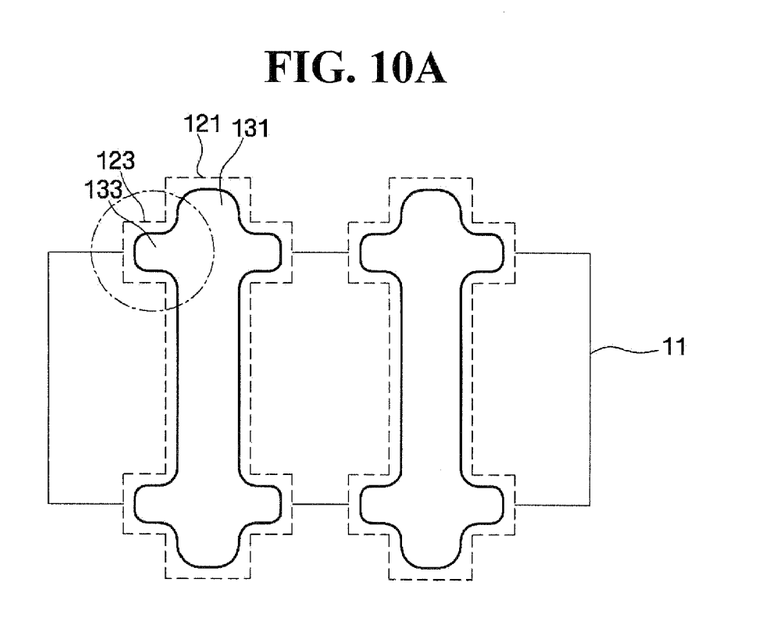
FIG. 10A shows a top view of a gate line that is formed with a photomask according to the exemplary embodiment of the present invention.

Hereinafter, the gate lines, which are formed using the photomask, according to exemplary embodiments of the present invention, will be described with reference to FIGS. 10A and 10B. FIG. 10A shows a top view of the gate lines that are formed with the photomask according to the exemplary embodiment of the present invention, and FIG. 10B shows an enlarged portion of FIG. 10A.

Figure 10B:
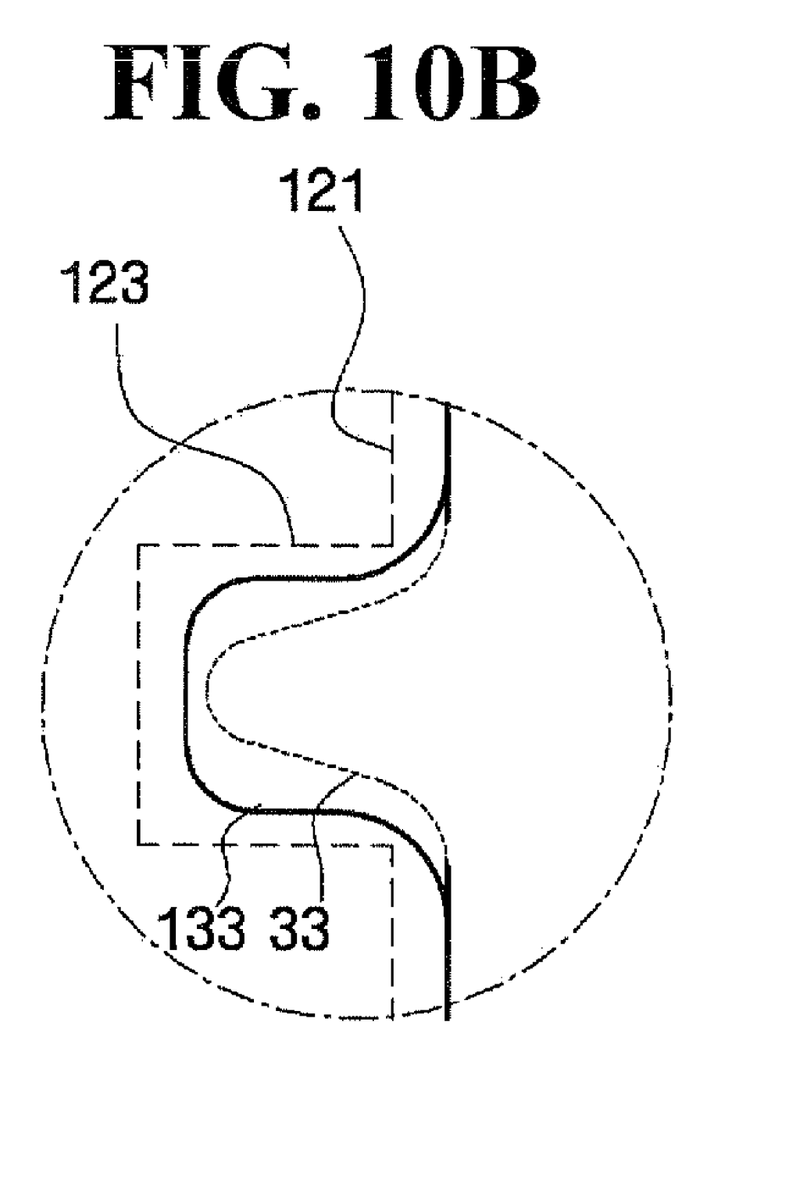
FIG. 10B is an enlarged portion of FIG. 10A showing in solid lines the resulting gate tab structure of the present invention as compared to the dashed outline of the mask structure used and the dotted lines of the gate tab formed according to methods practiced in the prior art.

Referring to FIGS. 10A and 10B, the corner regions of the gate tab patterns 133 are reinforced, so the shape of the gate tab patterns 133 is closer to a tetragon (e.g. closer in dimension and shape to gate tab mask pattern 123) than that of the conventional art. FIG. 10B shows the difference with the conventional gate tab pattern 33, which is formed with the conventional photomask which is both shorter and narrower than the pattern 133 formed by the inventive methods and using the inventive masks described above. Therefore, according to the embodiments of the present invention, the gate tab patterns 133 can be closer to a tetragon than that of the conventional art, that is, the gate tab patterns 133 have an extended width and enlarged size, so a short channel effect due to a possible misalignment can be minimized.

While the present invention has been particularly shown and described with reference to exemplary embodiments thereof, it will be apparent to those skilled in the art that the scope of the invention is given by the appended claims, rather than the preceding description, and all variations and equivalents that fall within the range of the claims are intended to be embraced therein. Therefore, it should be understood that the above embodiments are not limiting, but illustrative in all aspects.

As described above, according to the photomask for forming gate lines and the methods of manufacturing devices using the photomask of the present invention, one or more of the following effects can be observed.

First, a relatively large gate tab pattern can be formed using a photomask that includes joints between the adjacent gate tab mask pattern.

Second, the short channel effect at the boundary of the active region can be improved with the large gate tab pattern, so the characteristics and reliability of the semiconductor device can be improved.

What is claimed is:

1. A photomask, comprising: a photomask substrate;
   a plurality of gate line mask patterns adapted to span across at least one active region on a semiconductor substrate, first and second ones of the gate line mask patterns forming adjacent gate line patterns;
   gate mask pattern tabs extending from sides of each of the gate line mask patterns, gate mask pattern tabs on adjacent gate line patterns being adjacent gate mask pattern tabs;
   joints disposed between the adjacent gate mask pattern tabs; and
   a separation region included in the joints.

2. The photomask of claim 1, wherein the gate mask pattern tabs are arranged to cover at least a portion of a boundary between the active region and an isolation region of the semiconductor substrate.

3. The photomask of claim 1, further including a hole defined by only the joints.

4. The photomask of claim 1, further including a hole defined by the joints and one or more of the gate mask pattern tabs.

5. The photomask of claim 3, wherein the shape of the hole is one selected from the group consisting of a tetragon, a circle, an oval, a diamond, a triangle, and a polygon.

6. The photomask of claim 1, wherein the photomask is configured for light having a wavelength.

7. The photomask of claim 6, wherein a width of the separation region is equal to or less than half of the wavelength of the light.

8. The photomask of claim 1, wherein the photomask substrate is transparent, and the gate line mask patterns and the gate tab mask patterns are opaque.

9. The photomask of claim 6, wherein the photomask is configured so that light, transmitted through the gate line mask patterns, the gate tab mask patterns, and the joints, has a phase difference with light that is transmitted through only the photomask substrate.

10. The photomask of claim 1, wherein the gate line mask patterns are arranged parallel to each other.

11. A semiconductor device that is formed by a method of manufacturing, the method comprising:
   providing a semiconductor substrate that includes an active region defined by an isolation region;
   forming a gate insulating layer and a gate electrode layer on the semiconductor substrate;
   forming a photoresist layer on the gate electrode layer;
   forming a photoresist pattern that defines gate lines on the gate electrode layer by a photolithography process using a photomask using a light having a wavelength; and
   forming the gate lines by patterning the gate electrode layer,
   wherein the photomask comprises:
   a photomask substrate; gate line mask patterns that define the gate lines, which cross at least one of the active regions on the semiconductor substrate, and are arranged in parallel to each other;
   gate tab mask patterns extending from both sides of the each of the gate line mask patterns;
   joints formed between adjacent gate tab mask patterns; and
   a separation region including in the joints.

* * * * *